United States Patent
Lord (10) Patent No.: US 7,027,300 B2
(45) Date of Patent: Apr. 11, 2006

(54) COMPACT ELECTRONICS PLENUM

(75) Inventor: Charles Lord, Scottsdale, AZ (US)

(73) Assignee: Mobility Electronics, Inc., Scottsdale, AZ (US)

( * ) Notice: Subject to any disclaimer, the term of this patent is extended or adjusted under 35 U.S.C. 154(b) by 266 days.

(21) Appl. No.: 10/663,868

(22) Filed: Sep. 16, 2003

(65) Prior Publication Data

US 2005/0057899 A1     Mar. 17, 2005

(51) Int. Cl.
*H05K 7/20* (2006.01)

(52) U.S. Cl. ............... 361/695; 361/692; 361/694; 361/709; 165/80.3

(58) Field of Classification Search ............... 361/686, 361/687, 688, 690, 692, 695, 702–705, 714–719, 361/735, 741, 752, 756, 760, 764–768, 785, 361/789, 700, 802, 816; 257/706–727; 165/80.3, 165/80.4, 121, 122, 104.33, 104.34, 120, 165/185; 174/52.4, 16.3, 252, 254, 260, 174/15.1; 29/839, 840, 842, 845; 454/184
See application file for complete search history.

(56) References Cited

U.S. PATENT DOCUMENTS

| | | | |
|---|---|---|---|
| 5,060,112 A * | 10/1991 | Cocconi | 361/719 |
| 5,373,418 A * | 12/1994 | Hayasi | 361/707 |
| 5,440,450 A * | 8/1995 | Lau et al. | 361/695 |
| 5,838,066 A * | 11/1998 | Kitajo | 257/722 |
| 6,301,115 B1 * | 10/2001 | Hashimoto et al. | 361/704 |
| 6,333,852 B1 * | 12/2001 | Lin | 361/697 |
| 6,442,024 B1 * | 8/2002 | Shih | 361/695 |
| 6,657,860 B1 * | 12/2003 | Matsui et al. | 361/695 |
| 6,671,177 B1 * | 12/2003 | Han | 361/719 |
| 6,912,128 B1 * | 6/2005 | Bird et al. | 361/695 |

FOREIGN PATENT DOCUMENTS

JP    411298180 A   * 10/1999

* cited by examiner

*Primary Examiner*—Michael Datskovskiy
(74) *Attorney, Agent, or Firm*—Robert C. Klinger; Jackson Walker LLP (57) ABSTRACT

A plenum (12, 60) having a plurality of heat fins (40, 72) and also a receptacle (20) for receiving a heat generating component (22) in a friction fit arrangement. The plenum has a plurality of passageways (14, 66) defined by the plurality of fins arranged in rows, and also includes a plurality of openings (50, 76) disposed between the fin. The receptacle frictionally receives a respective heat generating component (22), and wicks heat to the fins. Air communicating through the passageways defined by the fins removes heat from the fins, and also creates a venturi effect to remove heat from within a housing via the openings to further cool the portable electronic device.

34 Claims, 6 Drawing Sheets

COMPACT ELECTRONICS PLENUM

FIELD OF THE INVENTION

The present invention is generally related to heat cooling systems for portable electronic devices, and more particularly to a heat cooling system including a plenum to remove heat from ultra-compact devices including power converters, transmitters, amplifiers, and so forth.

BACKGROUND OF THE INVENTION

The miniaturization of portable consumer electronic devices is being revolutionized by the dramatic miniaturization of electrical components, and the improved efficiencies of these electrical components. Exemplary miniaturized portable consumer electronics include power converter devices, transmitters, amplifiers, cell phones, PDA's, MP3 players, just to name a few, are made possible by improvements in technology.

While the miniaturization of components facilitates the overall reduction in device package size, a significant amount of heat is still generated by these components. It is increasingly difficult to effectively cool some of these smaller device packages as the heat generated per unit area is increasing. Power converter products, amplifiers, and communication devices, just to name a few, benefit significantly through the use of efficient cooling packages.

SUMMARY OF THE INVENTION

The present invention achieves technical advantages as a compact cooling system including a plenum formed of a thermally conductive material, the plenum including both a plurality of passageways adapted to pass air therethrough, and also having an integral receptacle adapted to wick heat from a heat generating component and transfer the heat to the passageways.

In one preferred embodiment of the present invention, the plenum is formed of a thermally conductive material, and has a base including a plurality of passageways adapted to pass air therethrough. These passageways are preferably defined by a plurality of fins extending outwardly from the base. The plenum further comprises an integral receptacle adapted to receive a heat generating component, such as a resistor, integrated circuit, or other heat generating component. The receptacle advantageously extends from the base at a location proximate, but remote from, the fins so as to thermally wick heat from the received heat generating component and transfer the heat to the fins. A fan creates air flow across the base and through the passageways proximate the fins so as to draw heat therefrom.

Advantageously, heat is efficiently transferred from the heat generating component to the plenum, and the plenum is efficiently cooled flowing air created the fan so as to provide an extremely compact design.

In one preferred embodiment of the present invention, the base has an upper surface and a lower surface, whereby the fins extend outwardly from the upper surface, and the receptacle extends outwardly from the lower surface. The base, fins and receptacle are formed as a unitary plenum, and the fins may be formed generally parallel to one another to define the plurality of adjacent passageways. A thermally conductive lid may be coupled to the plenum to define the passageways, whereby the fins separate one passageway from another. The fins are preferably formed as a plurality of generally collinear fins in a plurality of rows. The fins of each row are separated from one another and form a brush-like arrangement so that air passing thereacross, and therebetween, can efficiency transfer heat therefrom to provide maximum cooling efficiency.

In one embodiment of the present invention, the base may also include a plurality of openings extending therethrough and communicating with the passageways. These openings are adapted to generate a venturi effect when air is communicated thereacross and through the passageways, thereby drawing heat from inside a package, through the openings, and into the passageways for dispersing thereof.

The plenum receptacle is adapted to receive the respective heat generating component in a friction fit arrangement, and extends away from the fins, and may be opposed from the fins.

DETAILED DESCRIPTION OF THE PREFERRED EMBODIMENT

Figure 1:
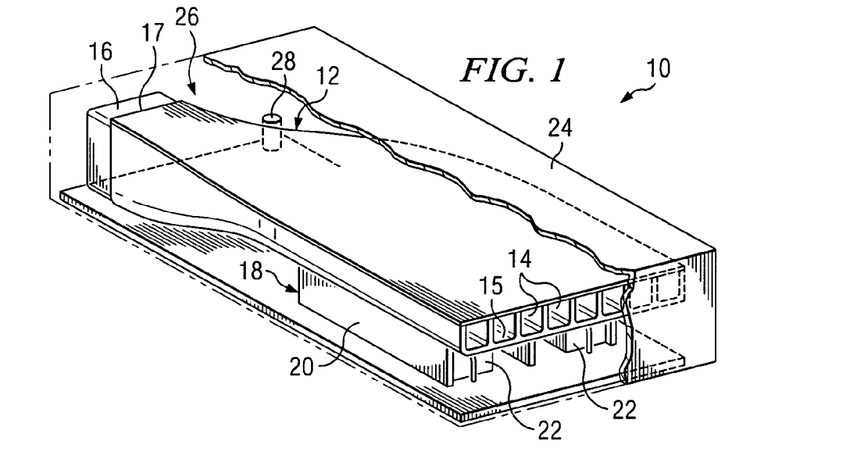
FIG. 1 is a perspective sectional view of a power converter including a plenum according to a first preferred embodiment of the present invention.

Referring now to FIG. 1, there is generally illustrated at 10 a power converter device thermally coupled to a plenum 12 according to a first preferred embodiment of the present invention. Plenum 12 is seen to have a plurality of passageways 14 each having an intake opening 15, and an opposing fan 16 at a exhaust opening 17 and thereof. Plenum 12 is also seen to include a plurality of receptacles 18 formed by integral downwardly extending members 20, each receptacle 18 seen to frictionally receive a respective heat generating electrical component 22. Plenum 12 is advantageously configured to wick heat from the heat generating members 22, and then transfer this heat to surface areas in contact with passageways 14 such that the flow of air therethrough removes heat therefrom. Device 10 is further seen to include a package housing 24 defining a chamber 26 therein housing other electrical component 28 forming a portion of the power converter housed therein.

Figure 2:
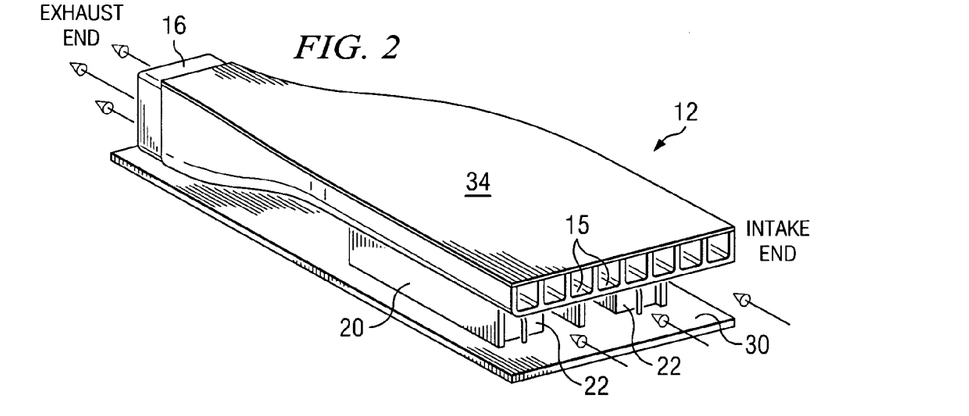
FIG. 2 is a perspective view of the plenum shown in FIG. 1.

Referring to FIG. 2, there is shown a perspective view of the plenum 12 secured upon a circuit board 30, which circuit board 30 forms a part of the power converter including heat generating components 22 and components 28. As shown, the downwardly extending receptacle members 20 are adapted to straddle and frictionally receive the respective heat generating components 22.

Figure 3:
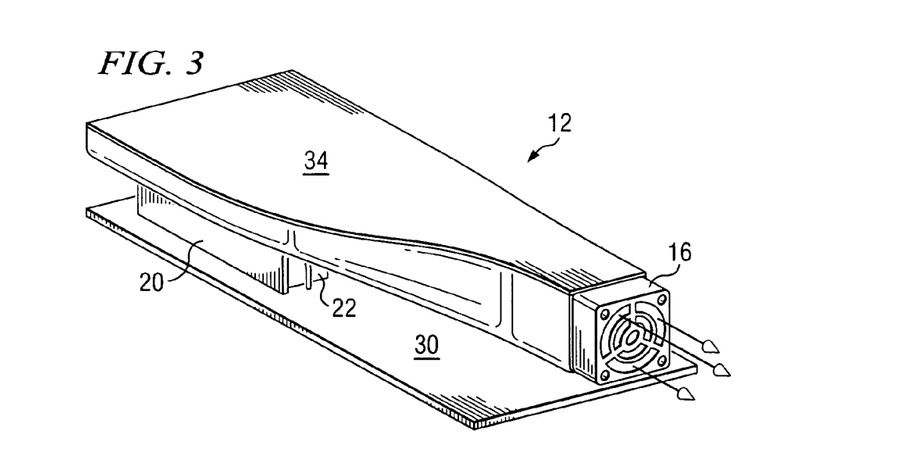
FIG. 3 is a perspective view of the exhaust end of the plenum of FIG. 2.

FIG. 3 depicts an end view of the plenum 12 of FIG. 2, illustrating the exhaust port 17 of the plenum 12 coupled to the fan 16 drawing air into the intake openings 15 as shown. Heat generating components 22 are depicted as resistors having leads soldered to solder pads defined on circuit board 30.

Figure 4:
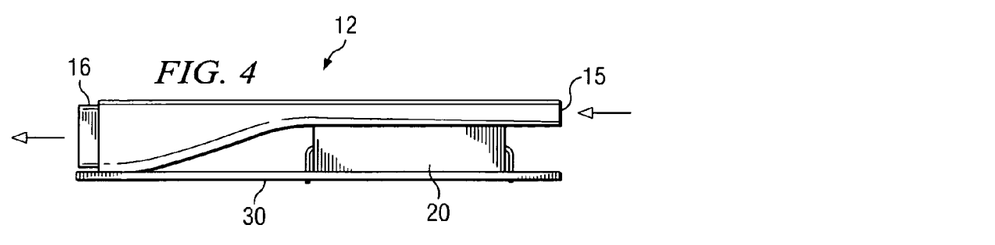
FIG. 4 is an elevational view of the plenum.
Figures 5, 6, 7:
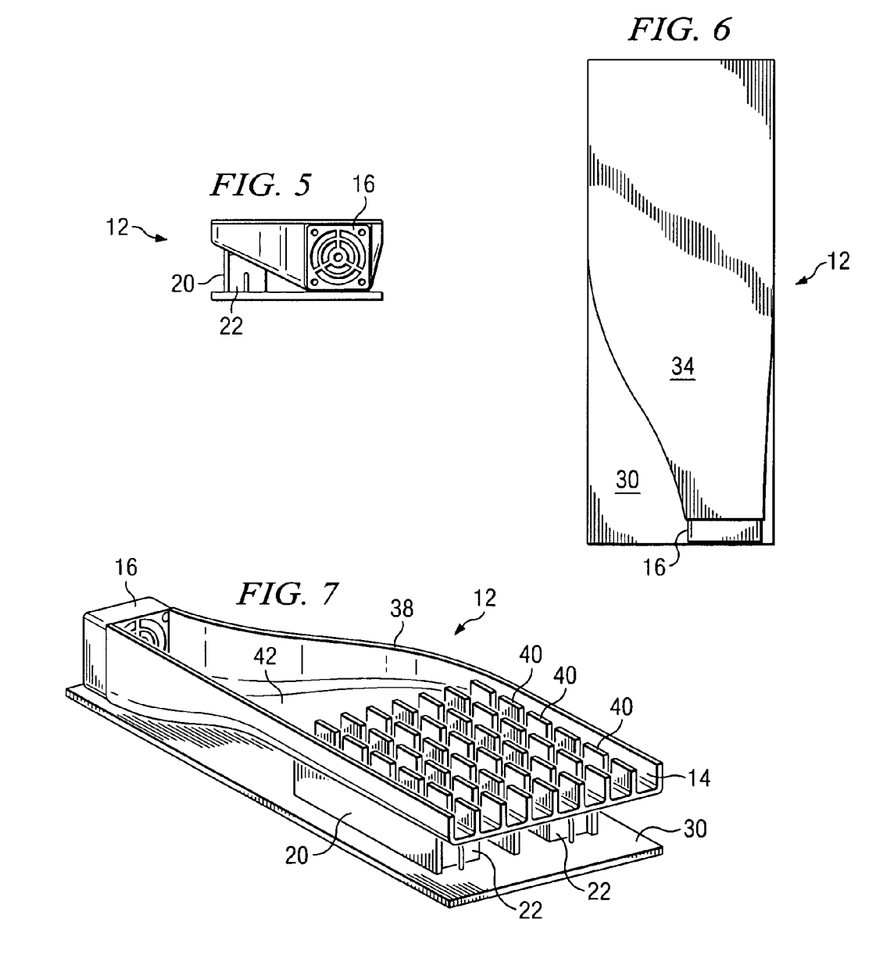
FIG. 5 is an end view of the plenum.
FIG. 6 is a top view of the plenum.
FIG. 7 is a top view of the plenum with the lid removed, illustrating the brush-like cooling fins and the funneled exhaust passageway coupled to the fins.

FIG. 4 depicts an elevational view of the plenum 12, FIG. 5 depicts an end view thereof, and FIG. 6 depicts a top view of the plenum of FIG. 2.

Figure 18:
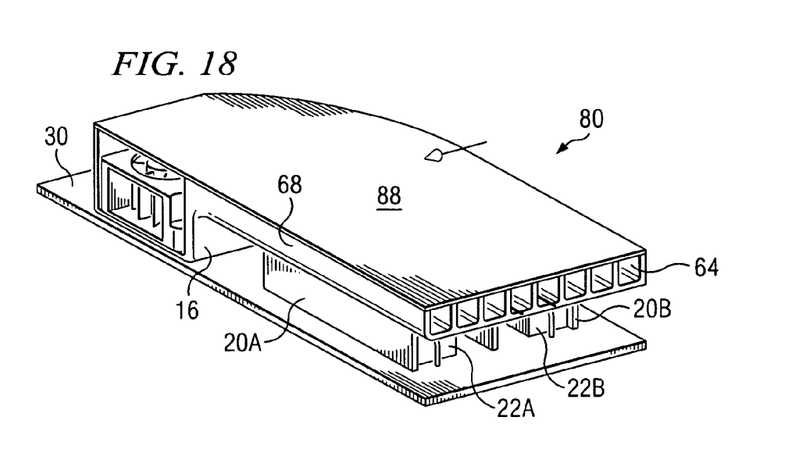
FIG. 18 is a perspective view of a third preferred embodiment showing a plenum comprised of a electrically non-conductive material separating pair of electrically conductive heatsinks.

Referring now to FIG. 7, there is illustrated the plenum 12 with a thermally conductive electrically non-conductive cover 34 removed therefrom. Plenum assembly 12 is seen to be comprised of a unitary thermally conductive base 38, such as comprised of aluminum oxide which advantageously is electrically non-conductive composite material but is highly thermally conductive, but may be comprised of an electrically conductive material such as copper or aluminum in some applications, such as shown in FIG. 18. Base 38 has a wide planar intake area including a plurality of integral, upwardly extending, cooling fins 40 arranged in rows, as shown. This arrangement of fins 40 resembles a brush such that air drafted into passageways 14 is exposed to the large surface area of the collective fins 40, and can communicate between the passageways 14. The middle portion of the unitary member 38 is seen to funnel downwardly and inwardly to define the generally rectangular exhaust port 17 having fan 16 secured thereacross. The total area of exhaust port 17 is roughly the same surface area as the collective area of intake openings 15.

Figure 8:
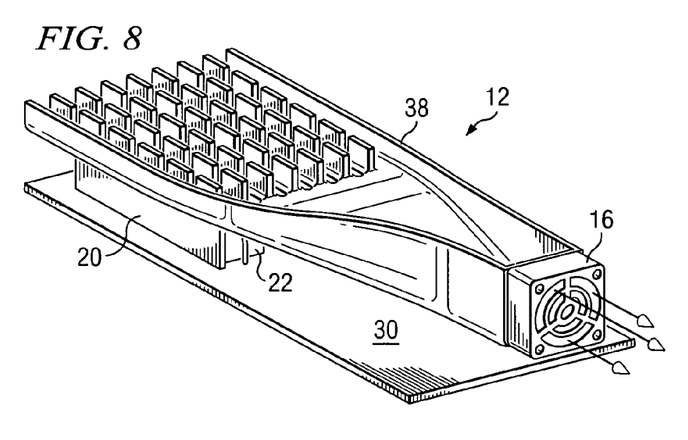
FIG. 8 is an end view of the plenum of FIG. 7.

FIG. 8 depicts the end view of the plenum 12, further illustrating the exhaust opening 17 facing the intake openings 15 of passageways 14 at the opposing end thereof. Advantageously, air generally flows in a common plane from the intake openings 15 to the exhaust opening 17 for exhausting by fan 16. This generally planar design provides minimal resistance for air to flow therethrough and across the brush-like fin arrangement created by fins 40.

Figure 9:
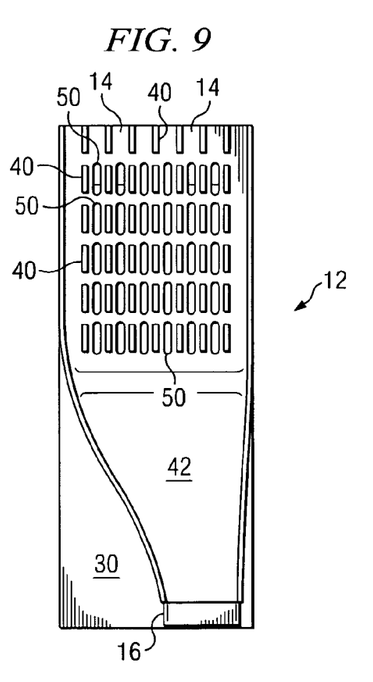
FIG. 9 is a top view of the plenum.

Referring now to FIG. 9, there is depicted a top view of the plenum 12 with the lid 34 removed, further depicting a linear array of openings 50 defined between each row of fins 40. Openings 50 extend through the generally planar intake end of unitary base 38, each opening into the cavity 26 of device 10 proximate the heat generating components 22, as well as other electrical components 28 shown in FIG. 1. Advantageously, as air flows across each of these openings 50, a venturi effect is created, which venturi effect draws the heating air from within cavity 26 into the passageways 14 for exhausting via fan 16.

Advantageously, the plenum 12 removes heat from the heat generating components 22 via heat conducting members 20, and also using convection due to the venturi effect created by air flowing across openings 50. This dual-mode plenum removes heat generated by components in a vary tight package, and provides cooling thereof in a very compact design.

Figure 10:
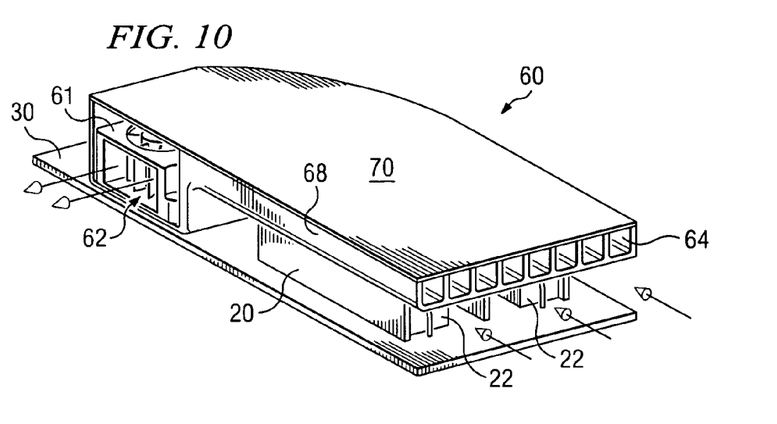
FIG. 10 is a perspective view of a second preferred embodiment of the present invention with the exhaust fan opening laterally.

Referring now to FIG. 10, there is generally shown at 60 a plenum according to a second preferred embodiment of the present invention similar to the first embodiment depicted in FIGS. 1–9. In this embodiment, plenum 60 is provided with an exhaust fan 61 to exhaust heated air laterally of the plenum assembly 60 via an exhaust port 62. Intake openings 64 communicating with passageways 66 are defined at the proximal end thereof and are defined generally 90 degrees with respect to the exhaust port 62.

Figure 11:
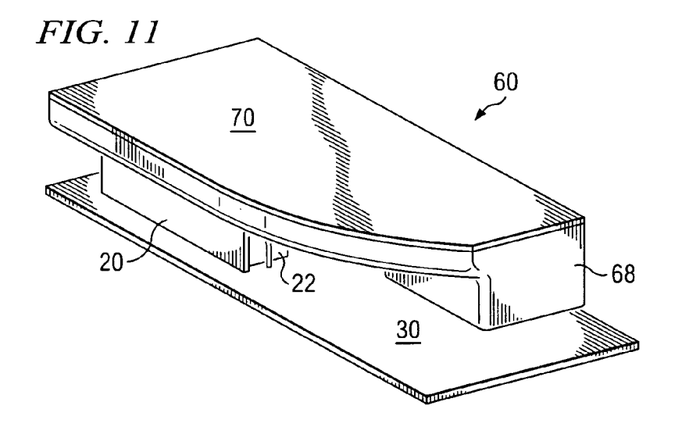
FIG. 11 is a perspective of the exhaust end of the plenum of FIG. 10.
Figure 12:
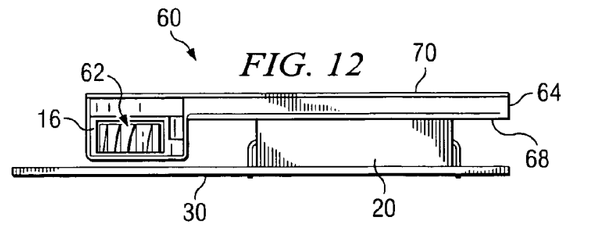
FIG. 12 is an elevational view of the plenum.

FIG. 11 depicts an end view of the of plenum 60, whereby FIG. 12 depicts an elevational view thereof. As shown in FIG. 12, the downwardly extending members 20 of receptacle 18 straddle each of the respective heat generating components 22 as previously discussed in regards to plenum 12. Members 20 frictionally engage the respective heat generating component 22 to wick away the heat generated thereby. Receptacle members 20 are also integrally formed with, and form a portion of, a unitary base 68 forming plenum 60.

Figure 13:
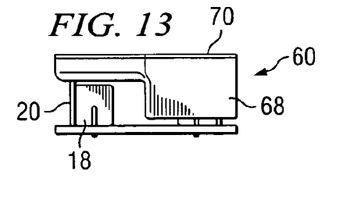
FIG. 13 is an end view of the plenum.
Figure 14:
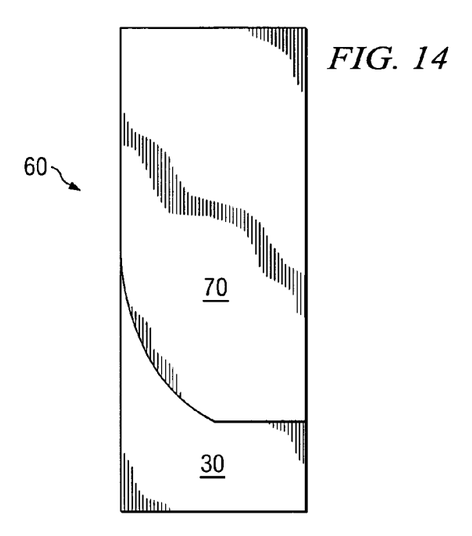
FIG. 14 is a top view of the plenum.

Referring now to FIG. 12, there is depicted an elevational view of the plenum assembly 60 illustrating the lateral exhaust port 62 defined by the fan 60. FIG. 13 depicts an end view of the plenum assembly 60, and FIG. 14 illustrates a top view thereof.

Figure 15:
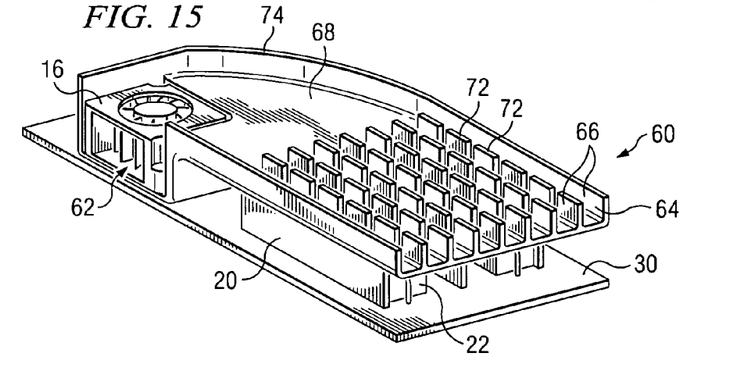
FIG. 15 is a perspective of the plenum of FIG. 10 with the lid removed.

Referring now to FIG. 15, there is depicted the plenum 60 with a lid 20 removed therefrom to reveal a plurality of cooling fins 72 being integral with, and extending from, an upper surface of the base 68, similar to fins 50 of plenum 12. Fins 72 are arranged in rows to define parallel air passageways 66, and are separated therefrom to provide a brush-like arrangement. Base 68 is further seen to have a sidewall curving at a mid-section 74 to route air flowing though the passageways 66 proximate fins 72 towards the fan 16, which exhausts air therefrom laterally of the plenum 60.

Figure 16:
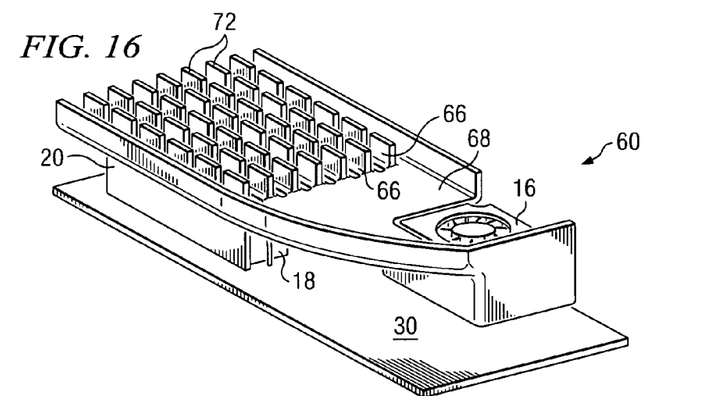
FIG. 16 is a perspective view of the rear of the plenum illustrated in FIG. 15.
Figure 17:
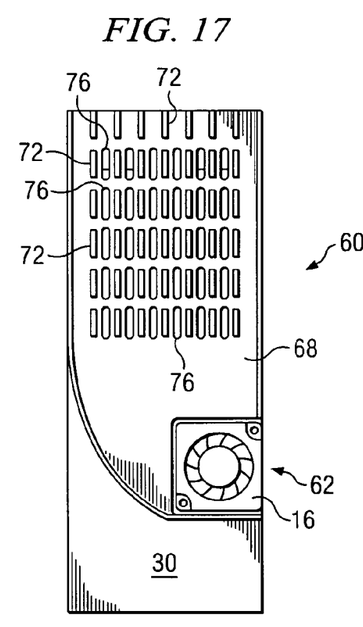
FIG. 17 is a top view of the plenum illustrated in FIG. 15.

FIG. 16 depicts an end view of plenum 60, and FIG. 17 depicts a top view thereof.

As shown in FIG. 17, plenum 60 is also seen to include a plurality of openings defined through base 68 depicted at 76. Openings 76 are defined in rows, disposed between the rows of fins 72, in a collinear arrangement. Opening 76 also create a venturi effect to remove heated air from within cavity 26, thereby removing heated air created by the heat generated components 22 and other components 28 forming a portion of the portable electronic device.

The plenum according to the present invention finds particular advantages cooling heat generating components of compact devices including, but not limited to, a power converter, transmitter, amplifier, communication device, and other compact portable electronics generating excessive heat.

The present invention derives technical advantages in that the base member includes both the upwardly extending fins and the downwardly extending receptacle members 20, which are preferably opposing each other to minimize the distance therebetween and maximum cooling efficiency. This unitary base member is formed using molding techniques in one preferred embodiment. This unitary base member is also preferably comprised of an electrically non-conductive material, but may be formed of an electrically conductive material such as when used in low power applications, or other applications as desirable.

Referring now to FIG. 18, there is generally shown at 80 a third preferred embodiment of the present invention wherein like numerals refer to like elements. Plenum 80 is seen to include the receptacles 20 identified as receptacle 20A and receptacle 20B, each frictionally receiving a respective heat generating component 22A and 22B.

Figure 19:
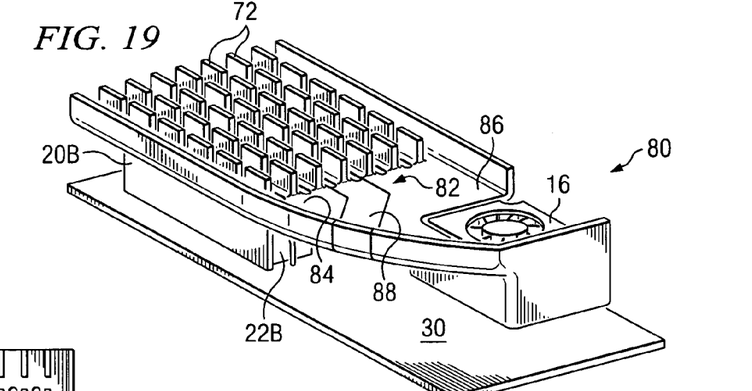
FIG. 19 is a perspective view of the third embodiment of FIG. 18 with the lid removed.

Referring now to FIG. 19, there is illustrated lid 88, comprised of an electrically non-conductive material, being removed from plenum 80.

Embodiment 80 is similar to embodiment 68 of FIG. 15, with the exception that the base member generally shown at 82 is comprised of a first heatsink portion 84 and a second heatsink portion 86 separated from, and interconnected by, an electrically non-conductive strip portion 88. Receptacle 20A is formed integral with the first heatsink portion 84, and the second receptacle 20B is formed integral with the second heatsink portion 86, as shown. Both the receptacles 20A and 20B, as well as heatsink portions 84 and 86, are comprised of an electrically conductive material, and separated from each other, but joined by, the electrically non-conductive strip 86.

This embodiment achieves technical advantages as each of the receptacles and corresponding heatsink portions are formed of an electrically conductive material, as well as a thermally conductive material, yet are separated from each other by the thermally conductive, electrically non-conductive, strip 88 to provide suitable electrical isolation therebetween. Thus, the corresponding heat generating component 22A and 22B can each form a portion of two different circuits which are electrically isolated from one another, yet are advantageously thermally connected to one another to form the plenum 80. Receptacles 20A and 20B adapted to wick heat from the respective heat generating components 22A and 22B, and the cooling thereof via the plurality of fins 72, and openings 76. For instance, heat generating component 22A may form a portion of a DC/DC converter circuit, and heat generating component 22B may form a portion of a AC/DC converter circuit which are each electrically isolated from one another, but thermally coupled to each other. However, this is just but one example of an intended use for the plenum 80, and limitation to this use is not to be inferred. In another embodiment, one heatsink portion can be formed of an electrically conductive material, and the other portion formed of an electrically non-conductive material, eliminating the use of insulating strip 88.

Figure 20:
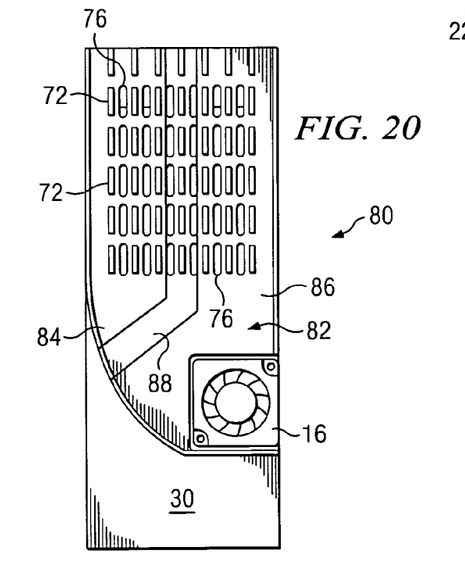
FIG. 20 is a top view of the third embodiment of FIG. 19.

Referring now to FIG. 20, there is shown a top view of the plenum 80 illustrated in FIG. 19, further illustrating the rows of openings 76 disposed between the rows of fins 72.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. A cooling system, comprising:
   a plenum formed of a thermally conductive material and having a base including a plurality of passageways adapted to pass air therethrough, the passageways being defined by a plurality of fins extending outwardly from the base;
   the plenum further comprising a receptacle adapted to receive a heat generating component, the receptacle also extending from the base at a location proximate, but remote from, the fins, the receptacle being adapted to thermally transfer heat from the received heat generating component to the fins, wherein the base is comprised of a pair of electrically conductive portions separated from each other, and joined by, an electrically non-conductive portion, further comprising a pair of said receptacles, each said receptacle being coupled to a respective said conductive portion; and
   a fan adapted to create air flow across the base and through the passageways.

2. The cooling system as specified in claim 1 wherein the base has an upper surface and a lower surface, wherein the fins extend outwardly from the upper surface and the receptacle extends outwardly from the lower surface.

3. The cooling system as specified in claim 1 wherein the base, the fins, and the receptacle are formed as a unitary member.

4. A cooling system, comprising:
   a plenum formed of a thermally conductive material and having a base including a plurality of passageways adapted to pass air therethrough, the passageways being defined by a plurality of fins extending outwardly from the base;
   the plenum further comprising a receptacle adapted to receive a heat generating component, the receptacle also extending from the base at a location proximate, but remote from, the fins, the receptacle being adapted to thermally transfer heat from the received heat generating component to the fins wherein the base is comprised of a first electrically conductive portion and a second electrically non-conductive portion, further comprising a pair of said receptacles, each said receptacle being coupled the one of the first and the second respective portions; and
   a fan adapted to create air flow across the base and through the passageways.

5. The cooling system as specified in claim 1 wherein the fins are formed generally parallel to one another to define the plurality of passageways.

6. The cooling system as specified in claim 1 further comprising a lid member coupled to the plenum to define the passageways, whereby the fins separate one passageway from another passageway.

7. A cooling system, comprising:
   a plenum formed of a thermally conductive material and having a base including a plurality of passageways adapted to pass air therethrough, the passageways being defined by a plurality of fins extending outwardly from the base;
   the plenum further comprising a receptacle adapted to receive a heat generating component, the receptacle also extending from the base at a location proximate, but remote from, the fins, the receptacle being adapted to thermally transfer heat from the received heat generating component to the fins, wherein the plenum has an intake port coupled to an exhaust port, wherein the passageways funnel from the intake port to the output port; and
   a fan adapted to create air flow across the base and through the passageways.

8. The cooling system as specified in claim 7 wherein the exhaust port opposes the intake port.

9. The cooling system as specified in claim 7 wherein the exhaust port opens laterally from the base.

10. The cooling system as specified in claim 1 wherein the fins are formed as a plurality of generally collinear fins in a plurality of rows.

11. A cooling system, comprising:
    a plenum formed of a thermally conductive material and having a base including a plurality of passageways adapted to pass air therethrough, the passageways being defined by a plurality of fins extending outwardly from the base;

the plenum further comprising a receptacle adapted to receive a heat generating component, the receptacle also extending from the base at a location proximate, but remote from, the fins, the receptacle being adapted to thermally transfer heat from the received heat generating component to the fins, wherein the base further includes a plurality of openings extending therethrough and communicating with the passageways, the openings being adapted to generate a venturi effect when air is communicated through the passageways; and a fan adapted to create air flow across the base and through the passageways.

12. The cooling system as specified in claim 1 wherein the fan is disposed proximate the exhaust port and draws air into the passageways via the intake port.

13. A cooling system, comprising:

a plenum formed of a thermally conductive material and having a base including a plurality of passageways adapted to pass air therethrough, the passageways being defined by a plurality of fins extending outwardly from the base;

the plenum further comprising a receptacle adapted to receive a heat generating component, the receptacle also extending from the base at a location proximate, but remote from, the fins, the receptacle being adapted to thermally transfer heat from the received heat generating component to the fins, wherein the plenum receptacle is adapted to receive the heat generating component in a friction fit arrangement; and a fan adapted to create air flow across the base and through the passageways.

14. The cooling system as specified in claim 13 wherein the receptacle extends away from the fins.

15. The cooling system as specified in claim 14 wherein the receptacle is opposed from the fins.

16. In combination;

A cooling system, comprising:

a plenum formed of a thermally conductive material and having a base including a plurality of passageways adapted to pass air therethrough, the passageways being defined by a plurality of fins extending outwardly from the base;

the plenum further comprising at least one receptacle adapted to receive a heat generating component, the receptacle also extending from the base at a location proximate, but remote from, the fins, the receptacle being adapted to thermally transfer heat to the fins;

a fan adapted to create air flow across the base and through the passageways;

a housing enclosing a plurality of components, wherein the base further includes a plurality of openings communicating the passageways to the enclosed components, whereby the fan creates a venturi effect proximate the openings to thermally draft heat from the enclosed components to the passageways; and a heat generating component disposed in, and thermally coupled to, the receptacle so as to thermally transfer heat generated by the heat generating component to the fins.

17. The cooling system as specified in claim 16 wherein the base has an upper surface and a lower surface, wherein the fins extend from the upper surface and the receptacle extends from the lower surface.

18. The cooling system as specified in claim 16 wherein the base, the fins, and the receptacle are formed as a unitary member.

19. A cooling system, comprising:

a plenum formed of a thermally conductive material and having a base including a plurality of passageways adapted to pass air therethrough, the passageways being defined by a plurality of fins extending outwardly from the base;

the plenum further comprising a receptacle adapted to receive a heat generating component, the receptacle also extending from the base at a location proximate, but remote from, the fins, the receptacle being adapted to thermally transfer heat from the received heat generating component to the fins, wherein the base is comprised of a pair of electrically conductive portions separated from each other, and joined by, an electrically non-conductive portion, further comprising a pair of said receptacles, each said receptacle being coupled to a respective said conductive portion; and a fan adapted to create air flow across the base and through the passageways; and a housing enclosing a plurality of components, wherein the base further includes a plurality of openings communicating the passageways to the enclosed components, whereby the fan creates a venturi effect proximate the openings to thermally draft heat from the enclosed components to the passageways.

20. A cooling system, comprising:

a plenum formed of a thermally conductive material and having a base including a plurality of passageways adapted to pass air therethrough, the passageways being defined by a plurality of fins extending outwardly from the base;

the plenum further comprising a receptacle adapted to receive a heat generating component, the receptacle also extending from the base at a location proximate, but remote from, the fins, the receptacle being adapted to thermally transfer heat from the received heat generating component to the fins, wherein the base is comprised of a pair of electrically conductive portions and a electrically non-conductive portion disposed therebetween, further comprising a pair of said receptacles, each said receptacle being coupled to one of said conductive portion; and a fan adapted to create air flow across the base and through the passageways.

21. The cooling system as specified in claim 16 wherein the fins are formed generally parallel to one another and define the plurality of passageways.

22. The cooling system as specified in claim 16 further comprising a lid member coupled to the plenum to define the passageways, whereby the fins separate one passageway from another passageway.

23. A cooling system, comprising:

a plenum formed of a thermally conductive material and having a base including a plurality of passageways adapted to pass air therethrough, the passageways being defined by a plurality of fins extending outwardly from the base;

the plenum further comprising a receptacle adapted to receive a heat generating component, the receptacle also extending from the base at a location proximate, but remote from, the fins, the receptacle being adapted to thermally transfer heat from the received heat generating component to the fins, wherein the plenum has an intake port coupled to an exhaust port, wherein the passageways funnel from the intake port to the output port; and a fan adapted to create air flow across the base and through the passageways.

24. The cooling system as specified in claim 23 wherein the exhaust port opposes the intake port.

25. The cooling system as specified in claim 23 wherein the exhaust port opens downwardly from the base.

26. The cooling system as specified in claim 16 wherein the fins are formed as a plurality of generally collinear fins disposed in a plurality of fin rows.

27. The cooling system as specified in claim 16 wherein the fan is disposed proximate the exhaust port and draws air into the passageways via the intake port.

28. A cooling system, comprising:

a plenum formed of a thermally conductive material and having a base including a plurality of passageways adapted to pass air therethrough, the passageways being defined by a plurality of fins extending outwardly from the base;

the plenum further comprising a receptacle adapted to receive a heat generating component, the receptacle also extending from the base at a location proximate, but remote from, the fins, the receptacle being adapted to thermally transfer heat from the received heat generating component to the fins, wherein the plenum receptacle receives the heat generating component in a friction fit arrangement; and a fan adapted to create air flow across the base and through the passageways.

29. The cooling system as specified in claim 16 wherein the receptacle extends away from the fins.

30. The cooling system as specified in claim 16 wherein the receptacle is opposed from the fins.

31. The cooling system as specified in claim 16 wherein the heat generating component is an electrical component.

32. The cooling system as specified in claim 16 wherein the heat generating component is a resistor.

33. The cooling system as specified in claim 16 wherein the heat generating component is transistor.

34. The cooling system as specified in claim 16 wherein the heat generating component is an integrated circuit.

* * * * *

UNITED STATES PATENT AND TRADEMARK OFFICE
CERTIFICATE OF CORRECTION

| | |
|---|---|
| PATENT NO. | : 7,027,300 B2 |
| APPLICATION NO. | : 10/663868 |
| DATED | : April 11, 2006 |
| INVENTOR(S) | : Charles Lord |

It is certified that error appears in the above-identified patent and that said Letters Patent is hereby corrected as shown below:

In column 6, line 29, after "coupled", insert the word --to--.

Signed and Sealed this

Nineteenth Day of December, 2006

JON W. DUDAS
*Director of the United States Patent and Trademark Office*